(12) United States Patent
Hao et al.

(10) Patent No.: US 6,245,689 B1
(45) Date of Patent: Jun. 12, 2001

(54) PROCESS FOR RELIABLE ULTRATHIN OXYNITRIDE FORMATION

(75) Inventors: Ming-Yin Hao, Sunnyvale; Robert Bertram Ogle, Jr., San Jose, both of CA (US); Derick Wristers, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/252,854

(22) Filed: Sep. 8, 1998

Related U.S. Application Data (62) Division of application No. 08/708,428, filed on Sep. 5, 1996, now Pat. No. 5,939,763.

(51) Int. Cl.$^7$ .......................... H01L 21/31; H01L 21/469
(52) U.S. Cl. .......................... 438/769; 438/770; 438/778; 438/786
(58) Field of Search .................................. 438/151, 287, 438/591, 769, 786, 787

(56) References Cited

U.S. PATENT DOCUMENTS

| | | | |
|---|---|---|---|
| 5,254,506 | * 10/1993 | Hori ...................................... | 438/769 |
| 5,407,870 | * 4/1995 | Okada et al. ........................ | 438/591 |
| 5,500,816 | * 3/1996 | Kobayashi ...................... | 438/185.28 |
| 5,650,344 | * 7/1997 | Ito et al. ............................... | 438/287 |
| 5,674,788 | * 10/1997 | Wristers et al. ...................... | 438/301 |
| 5,773,325 | * 6/1998 | Teramoto ............................. | 438/151 |
| 5,940,736 | * 8/1999 | Brady et al. .......................... | 438/787 |
| 6,001,694 | * 12/1999 | Shih et al. ............................. | 438/287 |

OTHER PUBLICATIONS

Yao et al., "High Quality Ultrathin Dielectric Films Grown on Silicon in a Nitric Oxide Ambient", Appl. Phys. Lett. 64(26), p 3584–6, Jun. 27, 1994.*

Yao, Z.–Q, "The Nature and Distribution of Nitrogen in Silicon Oxynitride Grown on Silicon in a Nitric Oxide Ambient", J. Appl. Phys., 78(5), P 2906–2912, Sep. 1, 1995.*

Yao et al., The Electrical Properties of Sub–5–nm Oxynitride Dielectrics Prepared in a Nitric Oxide Ambient Using Rapid Thermal processing, IEEE Electron Device Letters, 15(12), p 516–518, Dec. 12, 1994.*

Han et al., "Recent Developments in N2O/NO–Based Ultra Thin Oxynitride Gate Dielectrics for CMOS ULSI Applications", 4th International Conference on Solid–State and Integrated Circuit Technology. Proceedings, Beijing, China Oct., 24–28, 1995, New York.*

Kumar et al., "Optimization of Sub 3 nm Gate Dielectrics Grown by Rapid Thermal Oxidation in a Nitric Oxide Ambient", Appl. Phys. lett. 70(3), p 384–386, Jan. 20, 1997.*

* cited by examiner

Primary Examiner—Charles Bowers
Assistant Examiner—Asok Kumar Sarkar
(74) Attorney, Agent, or Firm—Gerald Fisher.; Deborah Wenocur (57) ABSTRACT

A process for growing an ultra-thin dielelctric layer for use as a MOSFET gate or a tunnel oxide for EEPROM's is described. A silicon oxynitride layer, with peaks in nitrogen concentration at the wafer-oxynitride interface and at the oxynitride surface and with low nitrogen concentration in the oxynitride bulk, is formed by a series of anneals in nitric oxide and nitrous oxide gas. This process provides precise thickness control, improved interface structure, low density electron traps, and impedes dopant impurity diffusion from/ to the dielelctric and substrate. The process is easily integrated into existing manufacturing processes, and adds little increased costs.

27 Claims, 5 Drawing Sheets

PROCESS FOR RELIABLE ULTRATHIN OXYNITRIDE FORMATION

CROSS REFERENCE TO RELATED APPLICATION

This application is a divisional under Rule 1.53(b) of application Ser. No. 08/708,428, now U.S. Pat. No. 5,939,763, filed Sep. 5, 1996. Application Ser. No. 08/708,428 is hereby incorporated by reference in its entirety into the subject application.

FIELD OF THE INVENTION

This invention relates to processes for the formation of ultra-thin dielectric layers for use as gate or tunnel oxides employed in integrated circuits.

BACKGROUND OF THE INVENTION

The trend in integrated circuits is toward higher performance, higher speed, and lower cost. Correspondingly, device dimensions and feature sizes are shrinking for all types of integrated circuit technology. This trend necessitates the use of ultra-thin dielectrics in the fabrication of such devices as Metal-Oxide-Semiconductor (MOS) transistors and floating gate memory elements.

MOS transistors are comprised of highly doped source and drain regions in a silicon substrate, and a conducting gate electrode is situated between the source and drain but separated from the substrate by a thin gate dielectric layer. When an appropriate voltage is applied to the gate electrode, a conducting channel is created between the source and drain. Shorter channels, shallower source and drain junctions, and thinner gate dielectrics are critical to achieving smaller and faster MOS devices.

Certain Electrically Erasable Programmable Read-Only Memory (EEPROM) elements utilize a two layer polysilicon structure comprising an electrically disconnected polysilicon gate electrode, referred to as "floating gate", and a second control transistor gate above the floating gate and more removed from the substrate. The floating gate, which retains electrical charge for a long time period unless altered by an external energy source, is charged or discharged by quantum mechanical tunneling of electrons through very thin dielectrics known as "tunnel oxides". The threshold voltage of the control transistor differs for the charged and uncharged states of the floating gate.

Presently, ultra thin dielectrics less than 100 Angstroms thick, usually of high quality $SiO_2$, are utilized as MOS gate dielectrics (commonly called gate oxides), and as tunnel oxides in floating gate EEPROM memory elements. Reliability and reproducibility of these ultra-thin oxides can be adversely affected by many factors including lack of thickness control, poor interface structure, high defect density, and impurity diffusion through the oxides. These factors can seriously degrade device performance.

Diffusion of impurities, particularly boron, through thin oxides is a major problem in processing technology. In Complementary MOS (CMOS) technology, many front end processing steps such as polysilicon gate deposition can be performed simultaneously for the NMOS and PMOS devices of CMOS circuits; however, the dopant implantation steps are performed separately, since different dopants are required. Arsenic and phosphorous, donor-type materials which provide free electrons as charge carriers, are most often used to dope the gate and source/drain regions of the NMOS devices. Boron, an acceptor-type material which provides free holes as charge carriers, is the most often used dopant for PMOS devices. Boron from the doped polysilicon gate has a much higher diffusion rate through the gate oxide layer than do arsenic or phosphorus, and can cause severe degradation of PMOS device characteristics. A concentration of charged boron ions within the gate oxide degrades the insulating characteristics of the oxide, causing gate oxide rupture at sufficiently high concentration. Additionally, boron charge within the gate oxide results in a shift of the transistor threshold voltage $V_T$. The magnitude of this shift is a function of the concentration of diffused boron ions times the depth of their penetration into the oxide. For ultra-thin gate oxides, boron can diffuse completely through the gate oxide into the underlying substrate, causing even more severe threshold shift problems. Similar problems with boron diffusion are evidenced for the very thin tunnel oxides used in floating gate memory elements of EEPROMS. The resulting degradation in oxide breakdown characteristics lowers the number of possible program erase cycles.

Poor interface structure between a Si substrate and an $SiO_2$ layer results largely from strain caused by lattice mismatch between Si and $SiO_2$. One consequence of this is the formation of interface states during high electric field stress or during exposure to high energy radiation such as x-rays. These interface states cause degradation of transistor turn-on characteristics.

Incorporation of nitrogen into the thin oxide layer has been shown to inhibit boron diffusion and to improve the Si—$SiO_2$ interfacial structure. Specifically, a nitrogen concentration profile having a double peaked structure with a peak of nitrogen at the Si—$SiO_2$ interface and a peak at the $SiO_2$ surface adjacent the polysilicon gate in MOSFET's, and having a low nitrogen concentration therebetween, has been shown to effectively impede boron diffusion from the doped polysilicon gate and to maintain oxide integrity. Additionally, incorporation of nitrogen at the Si—$SiO_2$ interface has been shown to relax the interfacial strain and improve the immunity of the oxides to interface state generation under high field stress.

Several methods for forming a nitrided oxide layer have been used. The first of these is referred to as the Nitrided Oxide (NO) method, which is described by M. Moslehi et al in *J Electrochem Soc: Solid State Science and Technology*, Vol 132, No. 9, September 1985, pp 2189–2197, which is hereby incorporated by reference. This method comprises growing a thin thermal oxide on the Si substrate which is then annealed in an ammonia ($NH_3$) atmosphere to incorporate nitrogen into the oxide. Furnace anneal was initially utilized, but most recently, Rapid Thermal Anneal (RTA) has been used as an alternative. Using the NO method, peaks in nitrogen concentration are seen at the Si—$SiO_2$ interface, hereafter referred to as the "interface", and at the $SiO_2$ surface adjacent the polysilicon gate in MOSFET's, hereafter referred to as the "oxide surface". The nitrogen concentration within the oxide film increases monotonically with nitridation time. Thin oxides fabricated using the NO method exhibit improved resistance to boron penetration, as well as improved Si—$SiO_2$ interfacial characteristics and low defect densities. However, decomposition of $NH_3$ during the nitridation process also results in incorporation of hydrogen into the $SiO_2$ layer. Si—H bonds and Si—OH bonds form, causing a large increase in electron and hole trapping and a high density of fixed charges, which result in threshold voltage instability for MOSFET's and degradation of breakdown endurance for MOSFET's and EEPROMs.

A second method, known as the reOxidized Nitrided Oxide (ONO) method, is described by T. Hori et al in *IEEE Transactions on Electron Devices*, Vol. 36, No. 2 February 1989, pp 340–350, also hereby incorporated by reference. The ONO method adds an additional high-temperature (800–1200° C.) oxidation step after the ammonia nitidation of the NO method. The hydrogen incorporated into the oxide layer during the ammonia nitridation is reduced by the oxygen present during the subsequent oxidation step, and diffuses out at the high oxidation temperature. As reoxidation proceeds, the hydrogen concentration in the film is found to decrease monotonically, with the rate of decrease depending on the reoxidation temperature and on the nitrogen peak concentration. The hydrogen concentration approaches a minimum value approximately equal to the hydrogen levels found in thermally grown oxide. A more heavily nitrided surface layer is thought to act as a higher barrier for oxygen diffusion, making the reoxidation process slower. The reduction in hydrogen concentration is shown to proportionately reduce the electron charge trapping evidenced in the nitrided oxides.

A disadvantage of the ONO method is the relatively narrow process window for achievement of optimum oxide quality. Over-reoxidation has been shown to actually degrade oxide electrical qualities. A further disadvantage of the NO and ONO processes is the high level of nitrogen in the bulk of the oxide. The bulk nitrogen concentration, which can be as high as $5-10 \times 10^{20}$ atoms/cc, weakens the dielectric and degrades its breakdown characteristics.

Another method of formation of an oxynitride layer utilizes an anneal in $N_2O$ ambients. Two variations of this method have been used:

1. Formation on a Si substrate of a thermal $SiO_2$ layer in oxygen ambient, followed by anneal in $N_2O$, which is described by A. Uchiyama et al in *IEDM Technical Digest, IEEE,* 1990, pp 425–428, hereby incorporated by reference, and 2. Growing of a thin silicon oxynitride layer directly on the Si substrate by high temperature exposure of the Si substrate to a pure $N_2O$ ambient, described by H. Hwang et al in *Appl Phys Lett* 57 (10), Sep. 3, 1990, pp 1010–1011, which is hereby incorporated by reference.

Dielectric layers formed by both of these variations exhibit a nitrogen peak at the Si—$SiO_2$ interface, and relatively small amounts of nitrogen incorporated into the oxide bulk. By way of example, a nitrogen peak concentration of $2-3 \times 10^{21}$/cc and a nitrogen concentration in the oxide bulk of approximately $10^{18}$/cc have been measured for a thermal oxide annealed at 1100 degrees Centigrade in $N_2O$. Compared with control thermal oxides, these oxynitrides show significant reduction in interface state generation under high field stress, and lowered electron trapping. They are also shown to act as a barrier for inhibiting boron penetration into the Si substrate. The relatively low nitrogen levels in the oxide bulk yield favorable oxide breakdown characteristics.

For ultra-thin silicon oxynitride dielectric layer growth, the oxidation of Si directly in an $N_2O$ ambient (the second variation of the above cited $N_2O$ method), has the added advantage of a suppressed growth rate. The growth rate of silicon oxynitride in pure $N_2O$ ambient at 1100° C. using an RTP has been measured as 1.2 Å/second. By comparison, the growth rate of oxide in an $O_2$ ambient for the same processing conditions is 10 Å/second. Simultaneous nitrogen incorporation with oxide growth results in gradual formation of an interfacial silicon oxynitride ($SiO_xN_y$) layer which acts as an oxidant diffusion barrier. The suppressed oxidation rate provides good thickness control even in the ultra-thin range (<60 Å).

A major problem with ultrathin oxides formed with $N_2O$ ambients is the absence of any nitrogen-rich layer at the oxide surface, as reported by H. Hwang et al, in *IEDM Technical Digest, IEEE,* 1990, pg. 424. Accordingly, no barrier exists to prevent boron from penetrating into the oxide, even if the nitrogen peak at the Si surface is effective in preventing boron penetration into the substrate. Furthermore, studies have shown that boron has diffused into the substrate for $N_2O$-based oxynitrides, indicating that their Si—$SiO_2$ interface nitrogen peak concentration is below the optimal level for blocking boron diffusion.

Another prior method of nitridation of a thermally grown $SiO_2$ layer, by either furnace or rapid thermal exposure directly to a nitric oxide (NO) ambient, has been reported very recently. The rapid thermal method is described by M. Bhat et al, in *IEDM Technical Digest, IEEE,* 1994, pp 329–332, which is hereby incorporated by reference. The depth profile, as measured by Secondary Ion Mass Spectrometry (SIMS), of nitrogen incorporated into the oxide is similar in shape to that of a thermal $SiO_2$ annealed in $N_2O$, and has an interface peak nitrogen concentration as high as $10^{22}$/cc for anneal at 1000 degrees Centigrade. This peak value is nearly 2 orders of magnitude higher than that seen by the authors for an $N_2O$ annealed oxide under similar processing conditions. The enhanced interfacial nitrogen peak also provides a highly self-limiting oxynitride growth due to the barrier properties of incorporated nitrogen to diffusion of oxidants. The thickness of the nitrogen-rich interface oxynitride layer saturates at a value of approximately 3 Å. The oxynitrides produced by exposure of thermal $SiO_2$ to NO, while having higher interface nitrogen peak levels than those produced in $N_2O$, share the problem of lacking a surface nitrogen barrier to prevent boron diffusion into the oxide layer itself.

It has been concluded from kinetic studies described by P. Tobin et al in *VLSI Tech. Sympos.,* 1993, pp 51–52, which is hereby incorporated by reference, that NO is the critical species producing interfacial nitrogen pileup during oxynitridation of thermal oxide in $N_2O$. Heating of the $N_2O$ causes its decomposition by the reactions:

$N_2O \rightarrow N_2+O$, where the atomic O recombines into $O_2$, and $N_2O+O \rightarrow 2NO$ It has been estimated that at 950° C., the $N_2O$ is fully decomposed before the $N_2O$ reaches the wafer, and the composition of the oxynitridation ambient is 64.3%$N_2$, 31.0%$O_2$, and 4.7%NO. Thus, the formation of a nitrogen interfacial peak by $N_2O$ anneal depends on the indirect, thermodynamically unfavorable dissociation reaction of $N_2O$ to NO. In contrast, the favorable, direct reaction of NO with Si is thought to produce the enhancement of interface nitrogen peak levels for NO-annealed oxides.

Still another method of incorporating nitrogen into a thin oxide layer is by ion implantation of nitrogen, described by Haddad et al in *IEEE Electron Device Letters,* Vol. EDL-8, No. 2, February 1987, pp 58–60, which has been utilized to provide a two-peaked nitrogen structure. Whereas this method can be effective for inhibiting boron diffusion and improving interface state generation and charge-to-breakdown values, it has numerous drawbacks. Ion implantation is expensive, and incorporating it into the process during oxide growth involves major redesign of the standard CMOS manufacturing process. Additionally, the process windows for optimal implant dose and energy are narrow, to avoid damage to the dielectric structure while still improving breakdown characteristics.

SUMMARY OF THE INVENTION

We have provided an improved process for forming an ultra thin silicon oxynitride dielectric layer on a Si substrate with improved thickness control, electrical characteristics, and resistance to boron penetration into the oxide as well as into the Si substrate. In this process a thin nitrogen-rich silicon oxynitride layer is grown on the substrate, then further processing provides an oxynitride layer with a nitrogen peak at the silicon-dielectric interface, and a peak at the dielectric surface.

An object of this invention is to provide an improved process for forming an ultra thin dielectric layer on Si, and an improved ultra thin dielectric layer formed by this process.

Another object of this invention is to provide a process for forming an ultra thin silicon oxynitride layer on Si which is resistant to boron penetration, and a silicon oxynitride layer formed by this process.

Another object of this invention is to provide a process for forming an ultra thin silicon oxynitride layer on Si which has a low density of electron traps, and a silicon oxynitride layer formed by this process.

A further object of this invention is to provide a process for forming an ultra thin silicon oxynitride layer on Si with favorable oxide breakdown characteristics, and a silicon oxynitride layer formed by this process.

A further object of this invention is to provide a process for forming an ultra thin silicon oxynitride layer on Si with a peak in nitrogen concentration at the oxide-silicon interface and a peak in nitrogen concentration at the oxide surface, and a silicon oxynitride layer formed by this process.

A further object is to provide a process for forming an ultra thin silicon oxynitride layer on Si which has precise thickness control, and a silicon oxynitride layer formed by this process.

A further object is to provide a process for forming an ultra thin silicon oxynitride layer on Si which includes forming a self-limiting nitrogen-rich layer and thereafter forming an oxide beneath the nitrogen-rich layer with a second nitrogen-rich layer forming at the Si interface.

A further object is to provide a process for forming an ultra thin oxynitride layer on Si which does not utilize hydrogen-bearing species, and an oxynitride layer formed by this process.

A further object is to provide a process for forming an improved ultra thin oxynitride layer on Si which is compatible with existing semiconductor manufacturing process flow.

A further object is to provide a process for forming an improved ultra thin oxynitride layer on Si which does not substantially add to manufacturing costs.

BRIEF DESCRIPTION OF THE DRAWINGS

FIG. 2b is a schematic representation of the nitrogen concentration profile in the oxynitride layer of FIG. 2a.

DETAILED DESCRIPTION OF THE INVENTION

Figure 1:
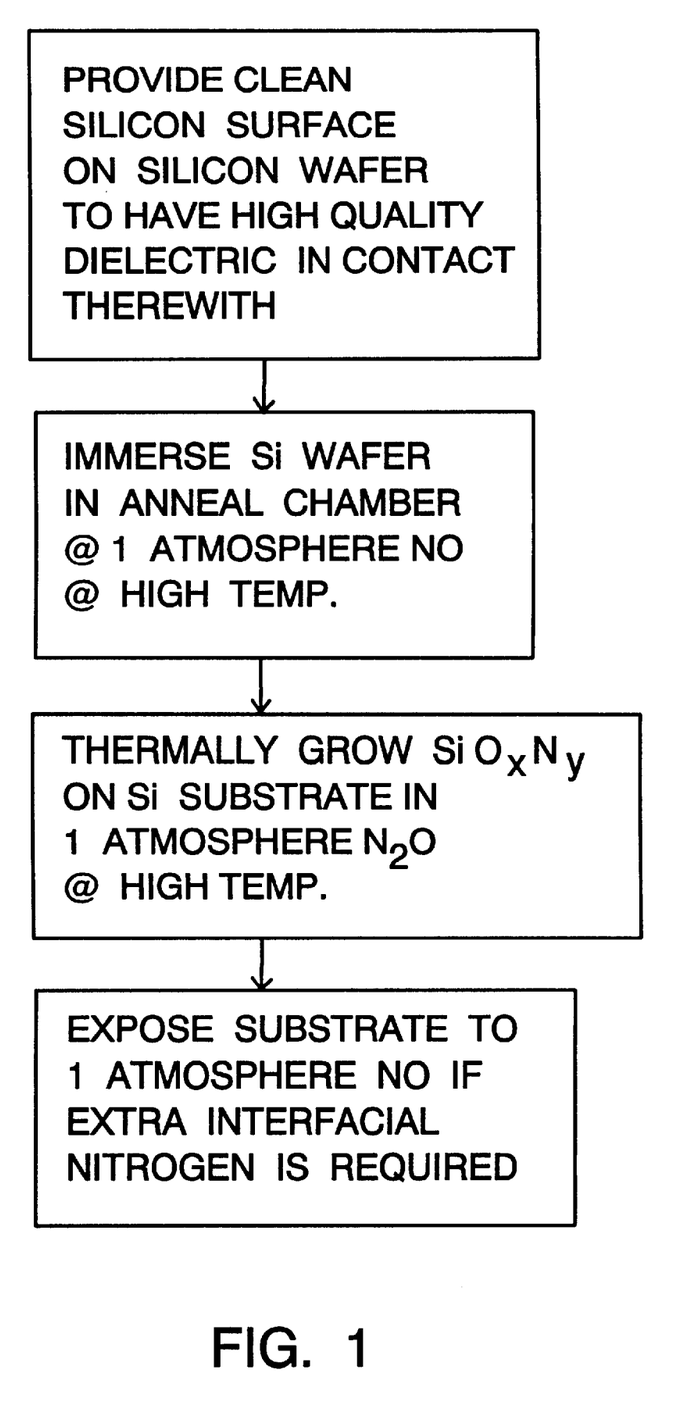
FIG. 1 is a process flow diagram for a preferred embodiment of the invention.

With reference to FIG. 1, a preferred process flow embodiment of our invention is shown. The entire process sequence has been performed in a Reactive Thermal Processing (RTP) system, such as the Rapid Thermal Reactor manufactured by PAPRO. In step 1, a silicon wafer is provided with a clean silicon surface on which to grow the dielectric layer. In step 2, the wafer is immersed in a one atmosphere pressure of nitric oxide (NO) gas at elevated temperatures in the range of 800° C. to 1150° C. for a time period in the range of 10 to 3000 seconds. In step 4, the NO flow is turned off, the NO is pumped out, and one atmosphere pressure of $N_2O$ is introduced. The wafer is annealed in the $N_2O$ at temperatures in the range of 800° C. to 1150° C. for a time period in the range of 10 to 3000 seconds. Other embodiments of the invention may utilize other oxidizing ambients in place of $N_2O$, oxygen or steam by way of example. In step 6, the $N_2O$ is pumped out, and an NO ambient is again introduced when additional nitrogen incorporation at the oxide/silicon interface is desired. In that case, the wafer is again annealed in NO at temperatures in the range of 800° to 1150° C. for a time period in the range of 10 to 3000 seconds.

Figure 2A:
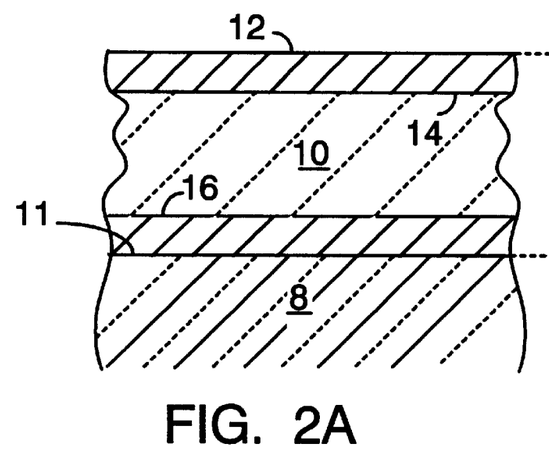
FIG. 2a is a cross sectional view of the preferred oxynitride layer structure.
Figure 2B:
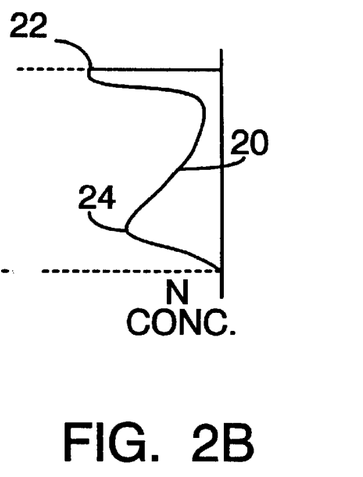
Figures 2C, 2E:
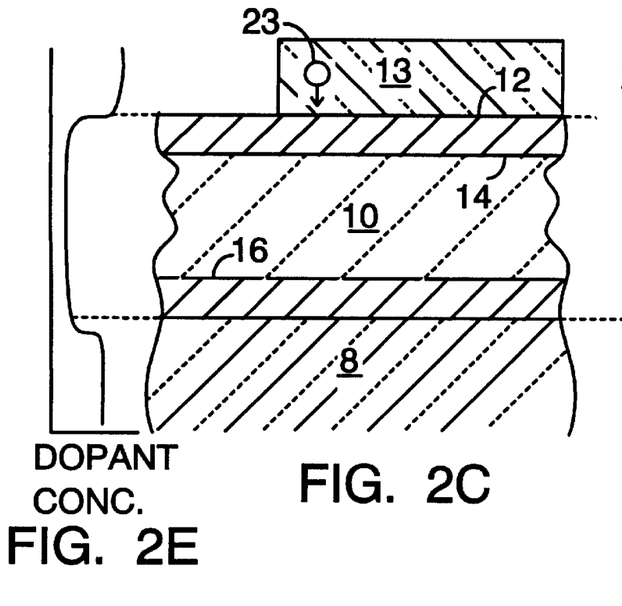
FIG. 2c is a cross sectional view of the preferred oxynitride layer structure utilized in a MOS transistor structure.
FIG. 2e is a schematic representation of the concentration profile of dopant species in the MOS transistor structure of FIG. 2c.
Figure 2D:
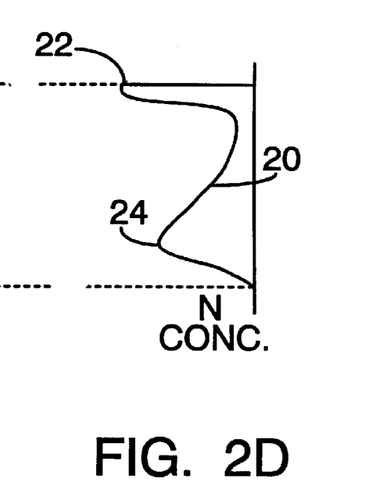
FIG. 2d is a schematic representation of the nitrogen concentration profile in the oxynitride layer of FIG. 2c.

With reference to FIG. 2a, the preferred structure for the oxynitride layer on the Si substrate is shown. Substrate 8 is annealed in NO and $N_2O$ gases as described in the process flow, forming dielectric oxynitride layer 10 on surface 11. Upper surface 12 of oxynitride layer 10 would be adjacent to any subsequently formed conducting gate for a MOS transistor. Surface region 14, and interface region 16 of dielectric 10 have elevated nitrogen concentrations, as represented by nitrogen concentration profile 20 in FIG. 2b. Nitrogen concentration surface peak 22 and nitrogen concentration interface peak 24 provide barriers to impurity diffusion through dielectric 10, as well as improving structure of the Si-dielectric interface at surface 11. In FIG. 2c, the preferred structure for oxynitride layer 10 on Si substrate 8 is shown, with a conducting gate 13 such as heavily doped polysilicon above the oxynitride layer 10. Nitrogen surface peak 22 in region 14 provides a barrier to impurity diffusion of impurities 23 from polysilicon gate 13 into oxynitride 10. FIG. 2e schematically illustrates the abrupt concentration profile of a dopant species of a transistor according to this invention in which the oxynitride layer of this invention is seen to preclude the diffusion of the high concentration dopant from the conductive polysilicon gate 13 into or across the oxynitride layer 10, as well as serving as a barrier for diffusion of dopant species from or into the underlying Si 8.

TABLE I

Effect of $N_2O$ cycle parameters on oxide thickness

| Sample Description ($N_2O$ cycle) | Oxide Thickness (Å) |
|---|---|
| I. 100 sec. @ 1050° C. (RTA) | 45 |
| II. 200 sec. @ 1100° C. (RTA) | 110 |

Table I summarizes $N_2O$ anneal conditions and thickness data for oxide grown on Si substrates processed according to the process flow of FIG. 1. The data is obtained from SIMS analysis, with a low energy, low fluence $Cs^+$ ion beam used to collect depth profiles of $CsO^+$, $CsN^+$, and $CsSi^+$ molecular clusters. The position of the oxide/Si interface is defined as the depth at which the CsO signal drops by one decade. In all calculations and depth profiles the first few data points are excluded to eliminate the SIMS blast-through artifact. Unfortunately, this artifact prevents obtaining accurate data points at the surface of the oxide layer. SIMS analysis is described in *Semiconductor Material and Device Characterization*, D. K Schroder, John Wiley and Sons, 1990, Ch. 10.

For the experiments of Table I, substrate samples I and II have both been first rapidly thermally annealed in 1 atmosphere NO for 50 seconds, at a temperature of 1000° C. Then sample I is provided 100 seconds rapid thermal anneal in 1 atmosphere $N_2O$ at 1050° C. Measured oxide thickness on sample I is 45 Å, corresponding to a growth rate of 0.45 Å/sec. Sample II is provided 200 seconds rapid thermal anneal in 1 atmosphere $N_2O$ at 1100° C. Measured oxide thickness on sample II is 110 Å, corresponding to a growth rate of 0.55 Å/sec. These growth rates are approximately a factor of two lower than those observed in the prior art for oxidation in an $N_2O$ ambient without initial NO anneal.

For each of the samples, there is considerable oxide growth during the $N_2O$ anneal. This growth indicates that, during the $N_2O$ anneal, oxidizing species penetrate through the nitrogen-rich interface layer 16 formed during the initial NO anneal, since basic oxidation kinetic theory states that the oxidation reactions occur directly at the Si surface. Thus, the oxidation mechanism must involve the diffusion of atomic or molecular oxygen, which are products of the dissociation reaction of $N_2O$, through the nitrogen-rich interface region. Although the oxide growth occurs, it is quite slow, and therefore the inventive process provides precise control of the oxide thickness.

Figure 3:
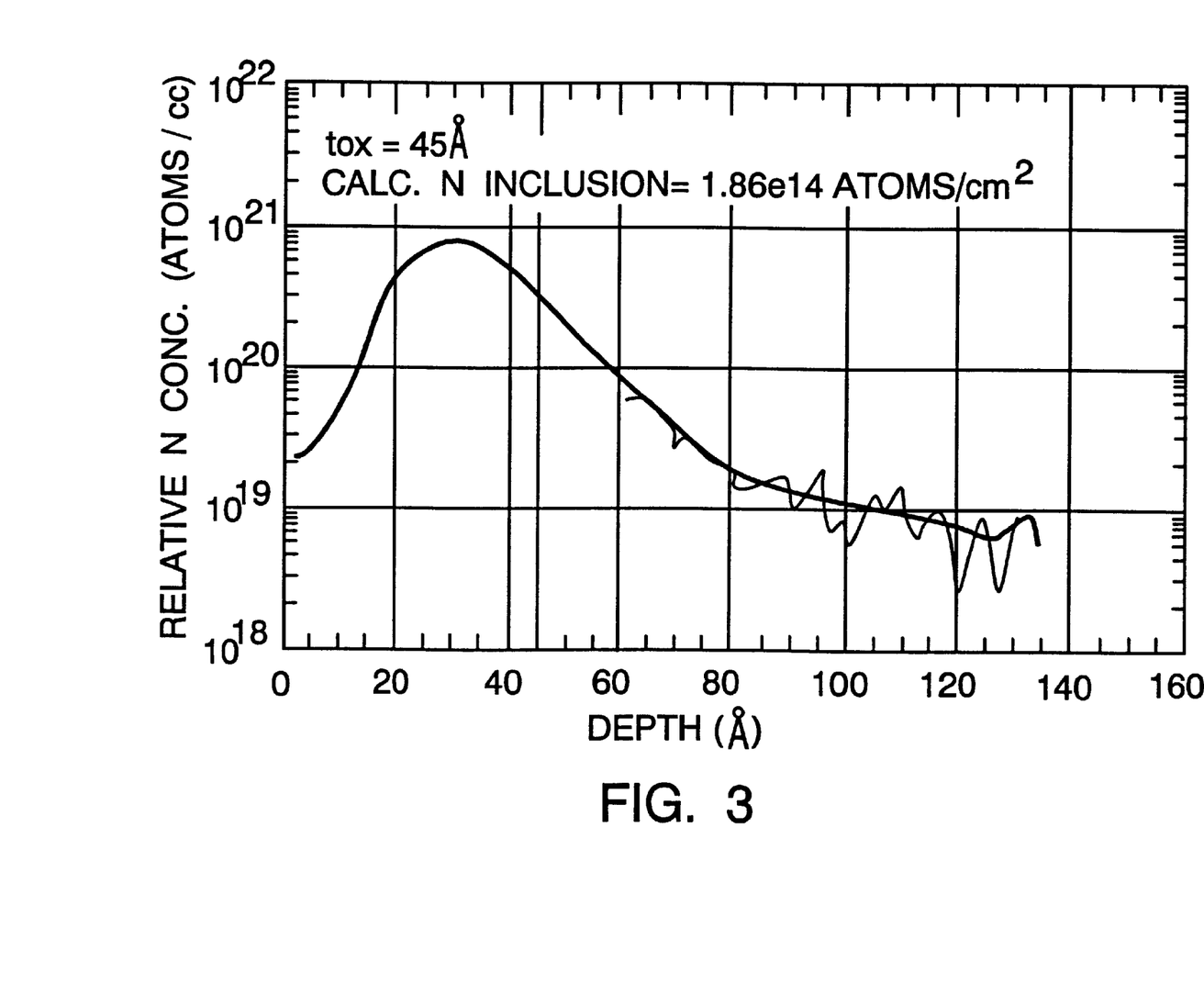
FIG. 3 is a SIMS profile of nitrogen concentration vs. depth below oxide surface, for a first sample processed according to this invention.

With reference to FIG. 3, a SIMS depth profile through the oxide layer and the Si—$SiO_2$ interface is shown for Sample I, but the data very near (i.e., within the first 10 Angstroms beneath) the oxide surface is excluded because of the blast through artifact. A peak nitrogen concentration of approximately $7 \times 10^{20}$ atoms/cc is seen near the Si—$SiO_2$ interface, at a depth of approximately 30 Å. This peak concentration corresponds to approximately 1 atomic% nitrogen.

Figure 4:
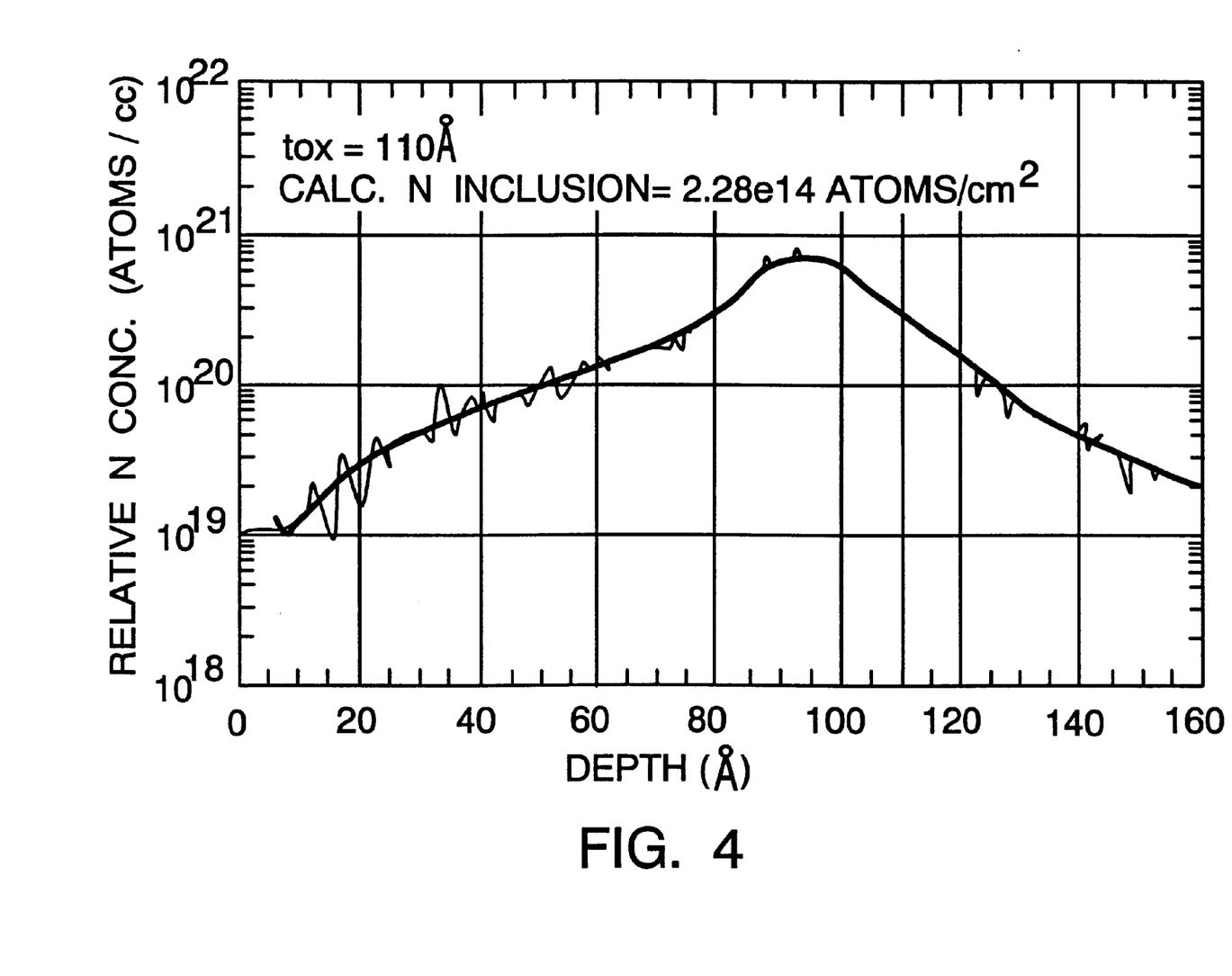
FIG. 4 is a SIMS profile of nitrogen concentration vs. depth below oxide surface, for a second sample processed according to this invention.

With reference to FIG. 4, a SIMS depth profile through the oxide layer and the Si—$SiO_2$ interface is shown for Sample II, again with the surface data excluded. A peak nitrogen concentration of approximately $6 \times 10^{20}$ atoms/cc is seen near the Si—$SiO_2$ interface, at a depth of approximately 90 Å. This peak concentration corresponds to approximately 0.9 atomic% nitrogen. For the samples of Table I, the hydrogen atom concentration in said silicon oxynitride layer is less than $10^{18}$ atoms/cc. Also, the bulk nitrogen concentration in said layer is less than $10^{18}$ atoms/cc.

Figure 5:
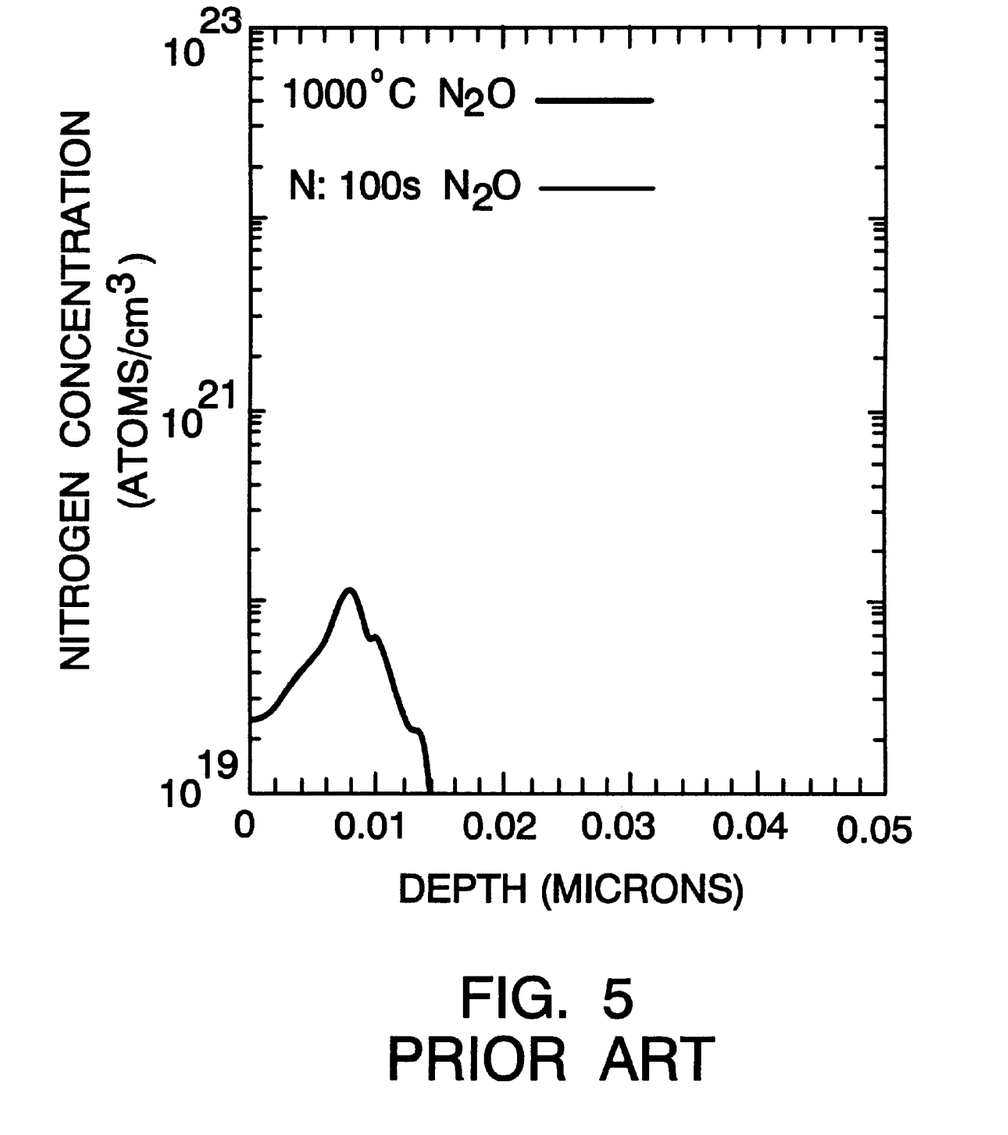
FIG. 5 is a prior art SIMS profile of nitrogen concentration vs. depth below oxide surface, for sample with thermal oxide annealed in $N_2O$.

FIG. 5 shows a SIMS depth profile from the reference by Bhat et al, cited above, for a thermally grown $SiO_2$ layer of 104 Å thickness rapidly thermally annealed in $N_2O$ at 1000° C. for 100 seconds. The surface data is excluded, as in FIGS. 3 and 4. It is seen that the position and magnitude of the nitrogen peak concentration closely match with those for substrate II after 200 seconds rapid thermal anneal in $N_2O$ at 1100° C., as seen from FIG. 4. The nitrogen incorporation in the bulk of the oxide and at the $SiO_2$—Si interface for the inventive process of an NO anneal followed by $N_2O$ anneal is quite similar to that for the prior art thermal $SiO_2$ annealed in $N_2O$. However, in the inventive process, since the oxygen species from the $N_2O$ dissociation reaction must penetrate the nitrogen-rich layer formed during NO anneal to grow the oxide layer at the Si surface, it is believed that the nitrogen-rich layer must be pushed up and remain at the surface of the oxide layer, even though it cannot be resolved by SIMS due to the SIMS blast-through artifact. The resultant structure will provide the desired double-peaked nitrogen profile for blocking of boron penetration into the oxide and substrate, and for yielding improved Si-oxide interface characteristics. The low nitrogen concentration in the oxide bulk will avoid degradation of oxide breakdown characteristics.

When higher interface nitrogen concentration is required, tailoring of the interface peak nitrogen concentration is accomplished by further anneal in NO ambient following the $N_2O$ anneal.

Our invention, in addition to providing the preferred nitrogen profile in the ultra thin oxide layers, involves process modifications which are easily incorporated into existing semiconductor manufacturing processes, and they add insubstantially to the cost of the process. Our invention provides precise oxide thickness control without narrowing the process window due to the extremely slow oxide growth rate. Also, the preferred embodiment of the inventive process is performed without introduction of any hydrogen species, and avoids hydrogen-induced charge trapping.

Although our preferred process utilizes rapid thermal processing in the temperature range 800° C. to 1150° C., and ambient atmospheric pressures of NO and $N_2O$, it is not essential that this exact method and parameters be used. Other embodiments may utilize furnace anneals for all the processes, and other oxidizing ambients such as $O_2$ or steam may be used in place of $N_2O$.

It is not our intention to limit our invention to the preferred embodiment, but rather the scope of our invention should be construed in view of our claims. With this in mind,

We claim:

1. An integrated circuit manufacturing process for making a thin dielectric layer on an exposed clean surface of a silicon substrate, comprising the steps of:

installing said silicon substrate in an annealing chamber;

providing a first ambient pressure of nitric oxide gas in said annealing chamber;

annealing said substrate at a first elevated temperature for a first period of time;

removing said nitric oxide gas from said annealing chamber;

providing a second ambient pressure of oxidizing gas in said annealing chamber;

annealing said substrate at a second elevated temperature for a second period of time;

said thin dielectric layer comprising a silicon oxynitride ($SiO_xN_y$) dielectric layer on said exposed clean surface of said silicon substrate, said $SiO_xN_y$ dielectric layer having an interface with said silicon substrate, and further having a surface opposite said interface, said $SiO_xN_y$ dielectric layer containing a first peak in nitrogen concentration proximal said interface, said first peak in nitrogen concentration extending across said $SiO_xN_y$ dielectric layer, said $SiO_xN_y$ dielectric layer further having a second peak in nitrogen concentration at said surface, said second peak in nitrogen concentration extending across said $SiO_xN_y$ dielectric layer, for inhibiting diffusion of dopants from contacting surfaces through said dielectric layer.

2. The process of claim 1, further comprising adjusting said first ambient nitric oxide pressure, said second ambient oxidizing gas pressure, and said first and second annealing temperatures and times to provide said first nitrogen concentration peak with at least $10^{18}$ nitrogen atoms/cc, and to provide said second nitrogen concentration peak with at least $10^{18}$ nitrogen atoms/cc.

3. The process of claim 1, wherein said first and second annealing steps comprise rapid thermal anneals.

4. The process of claim 1, wherein said oxidizing gas is selected from the group consisting of nitrous oxide, oxygen, steam, and mixtures of nitrous oxide, oxygen, and steam.

5. The process of claim 4, wherein said oxidizing gas is nitrous oxide.

6. The process of claim 5, wherein said first ambient pressure is in the range between 10 millitorr and 1 atmosphere, said first elevated temperature is in the range between 800 and 1150 degrees Centigrade, said first period of time is in the range between 10 and 3000 seconds, said second ambient pressure is in the range between 10 millitorr and 1 atmosphere, said second elevated temperature is in the range between 800 and 1150 degrees Centigrade, and said second period of time is in the range between 10 and 3000 seconds.

7. The process of claim 2, wherein said first and second anneal steps comprise furnace anneals.

8. The process of claim 1, further comprising the steps of, following said second annealing step, removing said oxidizing gas from said annealing chamber;
providing a third ambient pressure of nitric oxide gas in said annealing chamber; and
annealing said substrate at a third elevated temperature for a third period of time.

9. The process of claim 8, further comprising adjusting said first ambient nitric oxide pressure, said second ambient oxidizing gas pressure, and said first and second annealing temperatures and times to provide said first nitrogen concentration peak with at least $10^{18}$ nitrogen atoms/cc, and to provide said second nitrogen concentration peak with at least $10^{18}$ nitrogen atoms/cc.

10. The process of claim 8, wherein said first second and third annealing steps comprise rapid thermal anneals.

11. The process of claim 8, wherein said oxidizing gas is selected from the group consisting of nitrous oxide, oxygen, steam, and mixtures of nitrous oxide, oxygen and steam.

12. The process of claim 11, wherein said oxidizing gas is nitrous oxide.

13. The process of claim 12, wherein said first ambient pressure is in the range between 10 millitorr and 1 atmosphere, said first elevated temperature is in the range between 800 and 1150 degrees Centigrade, said first period of time is in the range between 10 and 3000 seconds, said second ambient pressure is in the range between 10 millitorr and 1 atmosphere, said second elevated temperature is in the range between 800 and 1150 degrees Centigrade, and said second period of time is in the range between 10 and 3000 seconds.

14. The process of claim 9, wherein said first and second anneal steps comprise furnace anneals.

15. An integrated circuit manufacturing process as in claim 2, wherein said first and second nitrogen concentration peaks are provided with at least $10^{20}$ nitrogen atoms/cc.

16. An integrated circuit manufacturing process as in claim 15, wherein said silicon oxynitride dielectric layer has a concentration of hydrogen atoms therein less than $10^{18}$ atoms/cc.

17. An integrated circuit manufacturing process as in claim 1, wherein said silicon oxynitride dielectric layer has a thickness not substantially exceeding 60 Angstroms.

18. An integrated circuit manufacturing process as in claim 17, wherein said first and second nitrogen concentration peaks are provided with at least $10^{20}$ nitrogen atoms/cc.

19. An integrated circuit manufacturing process as in claim 18, wherein said silicon oxynitride dielectric layer has a concentration of hydrogen atoms therein less than $10^{18}$ atoms/cc.

20. An integrated circuit manufacturing process as in claim 17, wherein said oxidizing gas is selected from the group consisting of nitrous oxide, oxygen, steam, and mixtures of nitrous oxide, oxygen, and steam.

21. An integrated circuit manufacturing process as in claim 20, wherein said oxidizing gas is nitrous oxide.

22. An integrated circuit manufacturing process as in claim 9, wherein said first and second nitrogen concentration peaks are provided with at least $10^{20}$ nitrogen atoms/cc.

23. An integrated circuit manufacturing process as in claim 22, wherein said oxidizing gas is selected from the group consisting of nitrous oxide, oxygen, steam, and mixtures of nitrous oxide, oxygen, and steam.

24. An integrated circuit manufacturing process as in claim 23, wherein said oxidizing gas is nitrous oxide.

25. An integrated circuit manufacturing process as in claim 24, wherein said silicon oxynitride layer has a concentration of hydrogen atoms therein less than $10^{18}$ atoms/cc.

26. A process for making an integrated circuit device in a silicon wafer comprising the steps of:
providing a portion of said silicon wafer, said portion having a concentration of acceptor or donor atoms therein to provide n-type or p-type semiconductor characteristics;
growing a silicon oxynitride layer having an intimate interface with said portion of said silicon wafer and a removed surface, said silicon oxynitride layer having a thickness not substantially exceeding 60 Angstroms;
depositing a conducting electrode onto said silicon oxynitride layer, said conducting electrode being in intimate contact with said removed surface portion of said silicon oxynitride layer;
said silicon oxynitride layer having a peak in nitrogen concentration adjacent said interface and a peak in nitrogen concentration at said removed surface and having a bulk nitrogen concentration between said peaks, said silicon oxynitride having substantially lower concentration of acceptor or donor atoms than both said portion of said silicon wafer and said conducting electrode, said bulk nitrogen concentration in said silicon oxynitride layer being less than $10^{18}$ atoms/cc, said nitrogen peak concentration adjacent said interface being greater than $10^{18}$ atoms/cc, said nitrogen peak concentration at said removed surface being greater than $10^{18}$ atoms/cc.

27. The integrated circuit device of claim 26 wherein said conducting electrode is a highly doped polysilicon.

* * * * *